(12) United States Patent
Stoller et al.

(10) Patent No.: US 11,594,292 B2
(45) Date of Patent: Feb. 28, 2023

(54) POWER LOSS IMMUNITY IN MEMORY PROGRAMMING OPERATIONS

(71) Applicant: Micron Technology, Inc., Boise, ID (US)

(72) Inventors: Scott A. Stoller, Boise, ID (US);
Pitamber Shukla, Boise, ID (US);
Kishore Kumar Muchherla, Fremont, CA (US); Fulvio Rori, Boise, ID (US);
Bin Wang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 12 days.

(21) Appl. No.: 17/238,818

(22) Filed: Apr. 23, 2021

(65) Prior Publication Data
US 2022/0343985 A1 Oct. 27, 2022

(51) Int. Cl.
| G11C 16/06 | (2006.01) |
| G11C 16/34 | (2006.01) |
| G11C 16/08 | (2006.01) |
| G11C 16/30 | (2006.01) |
| G11C 16/10 | (2006.01) |
| G11C 16/26 | (2006.01) |
| G11C 16/24 | (2006.01) |

(52) U.S. Cl.
CPC ......... *G11C 16/3459* (2013.01); *G11C 16/08* (2013.01); *G11C 16/102* (2013.01); *G11C 16/24* (2013.01); *G11C 16/26* (2013.01); *G11C 16/30* (2013.01); *G11C 16/3404* (2013.01)

(58) Field of Classification Search
CPC ... G11C 16/3459; G11C 16/08; G11C 16/102; G11C 16/24; G11C 16/26; G11C 16/30; G11C 16/3404
USPC ...................................... 365/185.22
See application file for complete search history.

(56) References Cited

U.S. PATENT DOCUMENTS

| 7,894,273 | B2 * | 2/2011 | Li | G11C 16/0483 |
| | | | | 365/185.24 |
| 8,130,556 | B2 * | 3/2012 | Lutze | G11C 16/10 |
| | | | | 365/230.01 |
| 8,391,070 | B2 * | 3/2013 | Bathul | G11C 16/04 |
| | | | | 365/185.19 |
| 8,982,626 | B2 * | 3/2015 | Dong | H01L 27/11582 |
| | | | | 365/185.17 |
| 9,437,319 | B1 * | 9/2016 | Suzuki | G11C 16/24 |
| 9,875,805 | B2 * | 1/2018 | Tseng | G11C 16/3459 |
| 10,535,412 | B2 * | 1/2020 | Yang | G11C 16/24 |

(Continued)

*Primary Examiner* — Viet Q Nguyen
(74) *Attorney, Agent, or Firm* — Lowenstein Sandler LLP

(57) ABSTRACT

Described are systems and methods for providing power loss immunity in memory programming operations. An example memory device comprises: a memory array comprising a plurality of memory cells electrically coupled to a plurality of wordlines and a plurality of bitlines; and a controller coupled to the memory array, the controller to perform operations comprising: causing a programming pulse to be applied to to one or more wordlines of the memory array; responsive to determining that a threshold voltage of one or more memory cells of the memory array has reached a pre-program verify level, causing a first bias voltage level to be applied to a first subset of bitlines of the memory array and causing a second bias voltage level to be applied to a second subset of bitlines of the memory array.

19 Claims, 12 Drawing Sheets

(56) References Cited

U.S. PATENT DOCUMENTS

| | | | |
|---|---|---|---|
| 10,614,898 B1* | 4/2020 | Yang | G11C 11/5671 |
| 11,037,640 B2* | 6/2021 | Baraskar | G11C 16/24 |
| 11,361,834 B1* | 6/2022 | Kumar | G11C 16/08 |
| 2005/0083735 A1* | 4/2005 | Chen | G11C 11/5628 |
| | | | 365/185.17 |
| 2016/0314844 A1* | 10/2016 | Dutta | G11C 16/26 |
| 2020/0211663 A1* | 7/2020 | Baraskar | G11C 16/3459 |

\* cited by examiner

POWER LOSS IMMUNITY IN MEMORY PROGRAMMING OPERATIONS

TECHNICAL FIELD

Embodiments of the disclosure relate generally to memory sub-systems, and more specifically, to providing power loss immunity in memory programming operations.

BACKGROUND

A memory sub-system can include high density non-volatile memory devices where retention of data is desired when no power is supplied to the memory device. One example of non-volatile memory devices is a negative-and (NAND) memory device.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
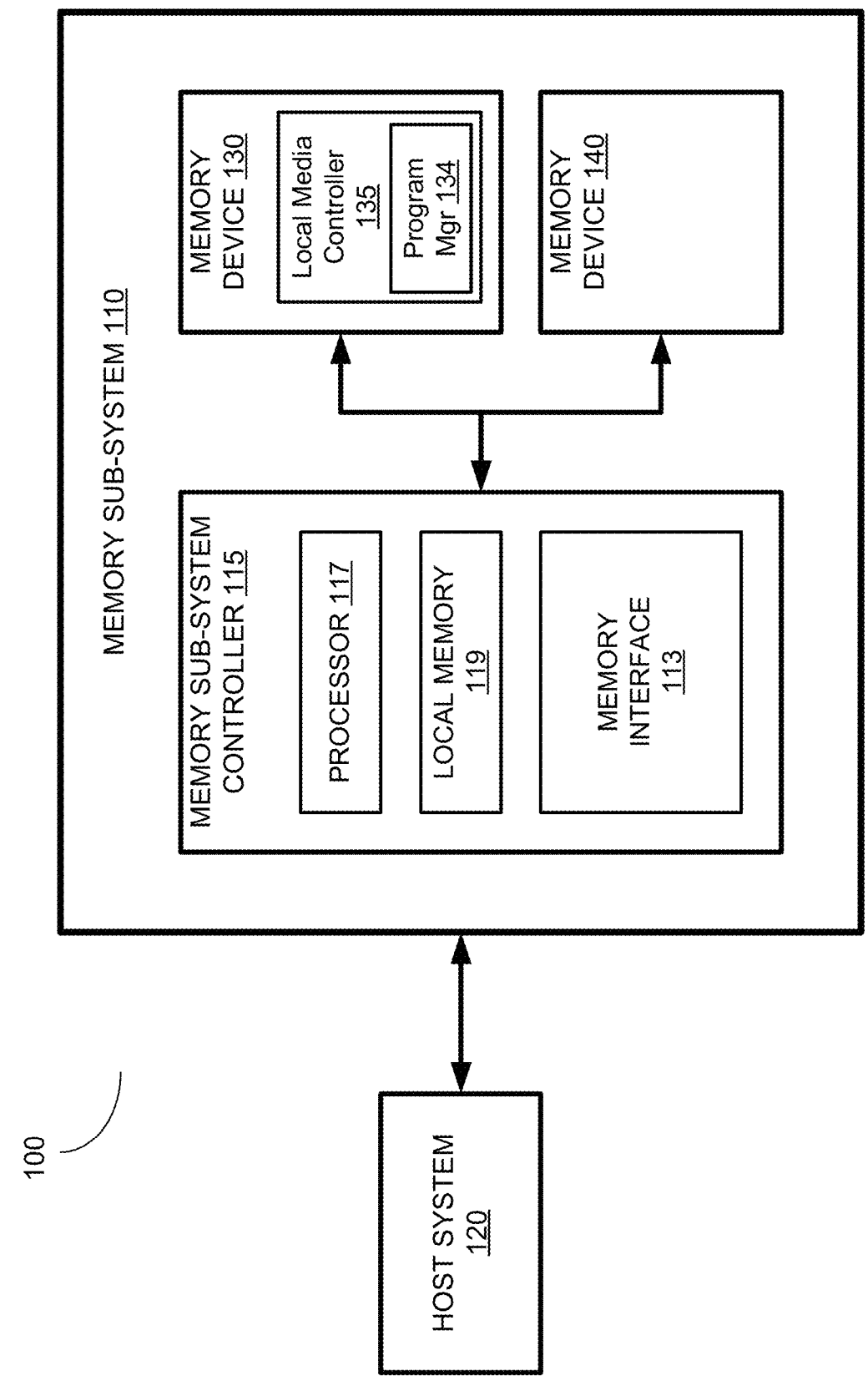
FIG. 1 illustrates an example computing system that includes a memory sub-system in accordance with some embodiments of the present disclosure.

Aspects of the present disclosure are directed to providing power loss immunity in memory programming operations. One or more memory devices can be a part of a memory sub-system, which can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can include two or more planes, such that each plane carries a matrix of memory cells formed onto a silicon wafer and joined by conductors referred to as wordlines and bitlines, such that a wordline joins multiple memory cells forming a row of the matric of memory cells, while a bitline joins multiple memory cells forming a column of the matric of memory cells. Depending on the cell type, each memory cell can store one or more bits of binary information, and has various logic states that correlate to the number of bits being stored. The logic states can be represented by binary values, such as "0" and "1", or combinations of such values. A set of memory cells referred to as a memory page can be programmed together in a single operation, e.g., by selecting consecutive bitlines.

A memory cell programming operation, which can be performed in response to receiving a write command from the host, can involve sequentially applying programming voltage pulses to a selected wordline. In some implementations, the programming pulse voltage can be sequentially ramped up from the initial voltage value (e.g., 0V) to the final voltage value (e.g., $V_{MAX}$). The unselected wordlines can, during the programming operation, be biased at a certain voltage, e.g., a passthrough voltage, which is less than the programming voltage.

In some embodiments, the memory controller can implement a two pass programming algorithm, which involves programming the lower page (LP) bits of the memory cells by the first programming pass, followed by programming the upper page (UP) bits and the extra page (XP) bits of the memory cells by the second programming pass. This algorithm can be referred to as 2-8 programming algorithm, to reflect the number of memory cell states programmed by each pass. The first programming pass forms two states for each memory cell. The second programming pass forms, for each memory cell, four states corresponding to each of the original two states. Thus, each memory cell would transition into one of eight possible states that are programmable by two sequential programming passes. In general, the operations described herein can be applied to memory devices having N-bit memory cells, where N>1.

By design, the non-volatile memory device is expected to maintain the programmed data irrespectively of the power supply state. However, some implementations of the above-described two pass programming can be susceptible to losing the programmed LP data if a power loss occurs during the second programming pass.

Aspects of the present disclosure address the above and other deficiencies by implementing a programming method that applies, to certain bitlines, various bias voltage levels depending on the state of the page buffer latches which store the bit values read from the programmed memory cells. This would result in slightly lower threshold voltage levels for certain bits, thus increasing the distribution valleys that are needed for successfully reading the lower page (LP) and upper page (UP) data, as described in more detail herein below.

Advantages of this approach include, but are not limited to, improved performance in the memory sub-system by ensuring the lower page (LP) and upper page (UP) data immunity through asynchronous power loss, as well as increasing the speed of programming operations.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory sub-system 110 includes a memory interface component 113. Memory interface component 113 is responsible for handling interactions of memory sub-system controller 115 with the memory devices of memory sub-system 110, such as memory device 130. In particular, the memory interface component 113 can manage programming operations with performed by the memory devices of memory sub-system 110, e.g., by implementing the memory programming techniques which provide power loss immunity, as described in more detail herein above. In an illustrative example, the memory sub-system controller 115 can include a processor 117 (processing device) configured to execute instructions stored in local memory 119 for performing the operations described herein.

Figure 2:
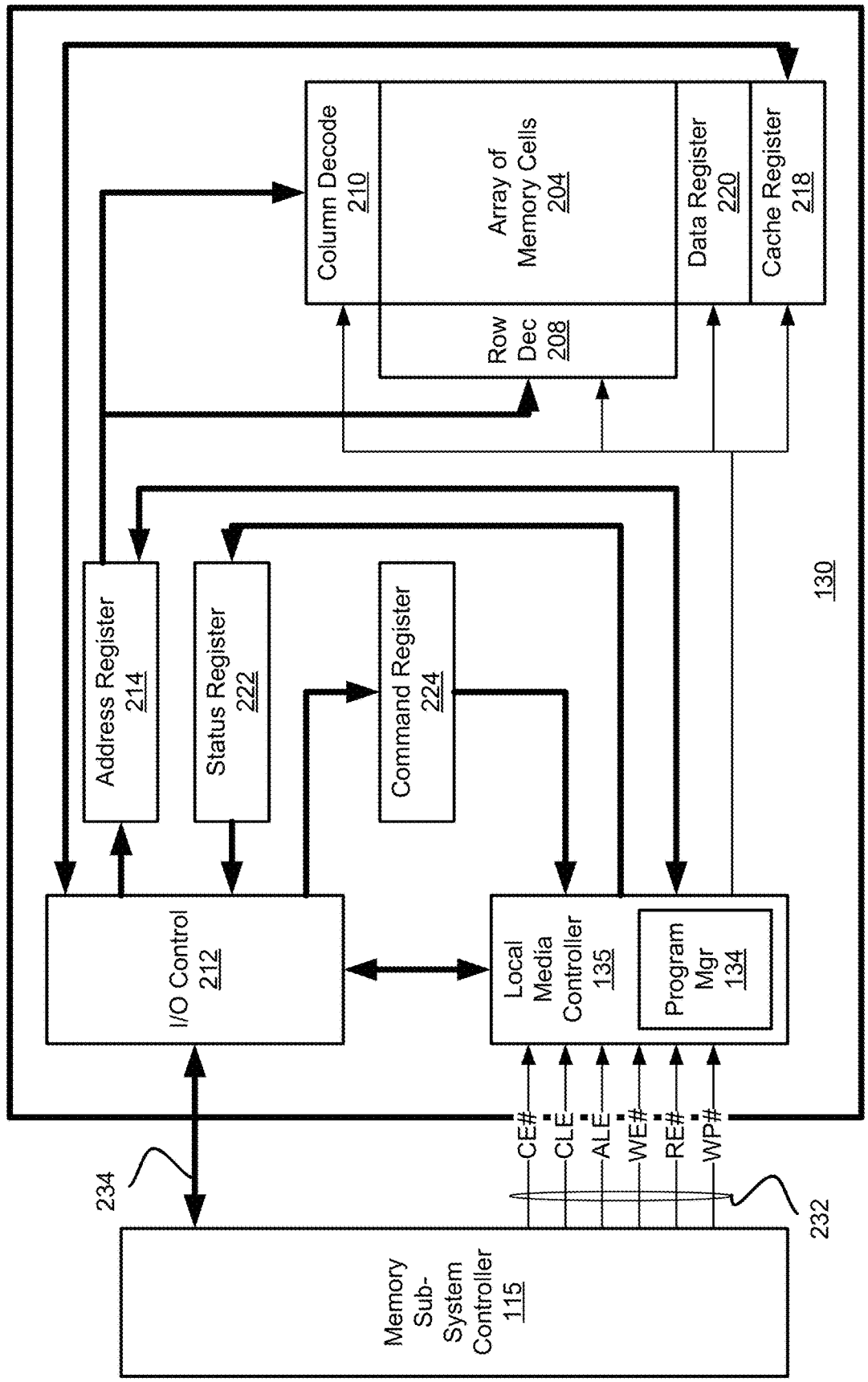
FIG. 2 is a block diagram of a memory device in communication with a memory sub-system controller of a memory sub-system, according to an embodiment.

FIG. 2 is a simplified block diagram of a first apparatus, in the form of a memory device 130, in communication with a second apparatus, in the form of a memory sub-system controller 115 of a memory sub-system (e.g., memory sub-system 110 of FIG. 1), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 204 logically arranged in rows and columns. Memory cells of a logical row are typically connected to the same access line (e.g., a wordline) while memory cells of a logical column are typically selectively connected to the same data line (e.g., a bit line). A single access line may be associated with more than one logical row of memory cells and a single data line may be associated with more than one logical column. Memory cells (not shown in FIG. 2) of at least a portion of array of memory cells 204 are capable of being programmed to one of at least two target data states.

Row decode circuitry 208 and column decode circuitry 210 are provided to decode address signals. Address signals are received and decoded to access the array of memory cells 204. Memory device 130 also includes input/output (I/O) control circuitry 212 to manage input of commands, addresses and data to the memory device 130 as well as output of data and status information from the memory device 130. An address register 214 is in communication with I/O control circuitry 212 and row decode circuitry 208 and column decode circuitry 210 to latch the address signals prior to decoding. A command register 224 is in communication with I/O control circuitry 212 and local media controller 135 to latch incoming commands.

A controller (e.g., the local media controller 135 internal to the memory device 130) controls access to the array of memory cells 204 in response to the commands and generates status information for the external memory sub-system controller 115, i.e., the local media controller 135 is configured to perform access operations (e.g., read operations, programming operations and/or erase operations) on the array of memory cells 204. The local media controller 135 is in communication with row decode circuitry 208 and column decode circuitry 210 to control the row decode circuitry 208 and column decode circuitry 210 in response to the addresses. In one embodiment, local media controller 135 includes programming manager 134, which can implement the memory programming operations with respect to memory device 130, as described herein.

The local media controller 135 is also in communication with a cache register 218. Cache register 218 latches data, either incoming or outgoing, as directed by the local media controller 135 to temporarily store data while the array of memory cells 204 is busy writing or reading, respectively, other data. During a program operation (e.g., write operation), data may be passed from the cache register 218 to the data register 220 for transfer to the array of memory cells 204; then new data may be latched in the cache register 218 from the I/O control circuitry 212. During a read operation, data may be passed from the cache register 218 to the I/O control circuitry 212 for output to the memory sub-system controller 115; then new data may be passed from the data register 220 to the cache register 218. The cache register 218 and/or the data register 220 may form (e.g., may form a portion of) a page buffer of the memory device 130. A page buffer may further include sensing devices (not shown in FIG. 2) to sense a data state of a memory cell of the array of memory cells 204, e.g., by sensing a state of a data line connected to that memory cell. A status register 222 may be in communication with I/O control circuitry 212 and the local memory controller 135 to latch the status information for output to the memory sub-system controller 115.

Memory device 130 receives control signals at the memory sub-system controller 115 from the local media controller 135 over a control link 232. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 232 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 234 and outputs data to the memory sub-system controller 115 over I/O bus 234.

For example, the commands may be received over input/output (I/O) pins [7:0] of I/O bus 234 at I/O control circuitry 212 and may then be written into command register 224. The addresses may be received over input/output (I/O) pins [7:0] of I/O bus 234 at I/O control circuitry 212 and may then be written into address register 214. The data may be received over input/output (I/O) pins [7:0] for an 8-bit device or input/output (I/O) pins [15:0] for a 16-bit device at I/O control circuitry 212 and then may be written into cache register 218. The data may be subsequently written into data register 220 for programming the array of memory cells 204.

In an embodiment, cache register 218 may be omitted, and the data may be written directly into data register 220. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

In some implementations, additional circuitry and signals can be provided, and that the memory device 130 of FIG. 2 has been simplified. It should be recognized that the functionality of the various block components described with reference to FIG. 2 may not necessarily be segregated to distinct components or component portions of an integrated circuit device. For example, a single component or component portion of an integrated circuit device could be adapted to perform the functionality of more than one block component of FIG. 2. Alternatively, one or more components or component portions of an integrated circuit device could be combined to perform the functionality of a single block component of FIG. 2. Additionally, while specific I/O pins are described in accordance with popular conventions for receipt and output of the various signals, it is noted that other combinations or numbers of I/O pins (or other I/O node structures) may be used in the various embodiments.

One or more memory devices of the memory sub-system 100 can be represented, e.g., by NAND memory devices that utilize transistor arrays built on semiconductor chips. As illustrated schematically in FIG. 3A, a memory cell of a memory device can be a transistor, such as metal-oxide-semiconductor field effect transistor (MOSFET), having a source (S) electrode and a drain (D) electrode to pass electric current there through. The source and drain electrodes can be connected to a conductive bitline (BL), which can be shared by multiple memory cells. FIG. 4 schematically illustrates an array or memory cells that can be connected to a plurality of wordlines (WL) and a plurality of bitlines (BL). The circuitry that can be used to selectively couple WLs and BLs to voltage sources providing control gate and source-drain signals, respectively, is not shown in FIG. 4 or clarity and conciseness.

Figure 3B:
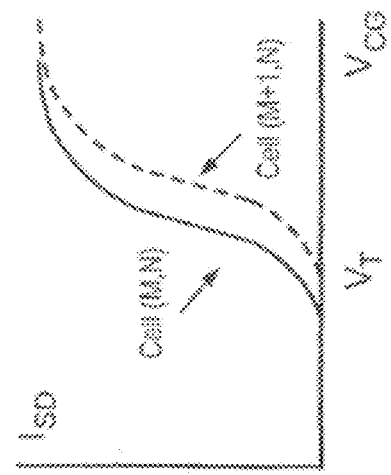
FIG. 3B schematically illustrates schematically dependence of the source-drain current on the control gate voltage for two memory cells.

Referring again to FIG. 3A, memory cells 302 and 304 can be connected to the same bitline N and two different conductive wordlines, M and M+1, respectively. A memory cell can further have a control gate (CG) electrode to receive a voltage signal $V_{CG}$ to control the magnitude of electric current flowing between the source electrode and the drain electrode. More specifically, there can be a threshold control gate voltage $V_T$ (herein also referred to as "threshold voltage" or simply as "threshold") such that for $V_{CG}<V_T$, the source-drain electric current can be low, but can increase substantially once the control gate voltage has exceeded the threshold voltage, $V_{CG}>V_T$. Transistors of the same memory device can be characterized by a distribution of their threshold voltages, $P(V_T)=dW/dV_T$, so that $dW=P(V_T)dV_T$ represents the probability that any given transistor has its threshold voltage within the interval $[V_T, V_T+dV_T]$. For example, FIG. 3B illustrates schematically dependence of the source-drain current $I_{SD}$ on the control gate voltage for two memory cells, e.g. memory cell 302 (solid line) and memory cell 304 (dashed line), having different threshold control gate voltages.

Figure 3A:
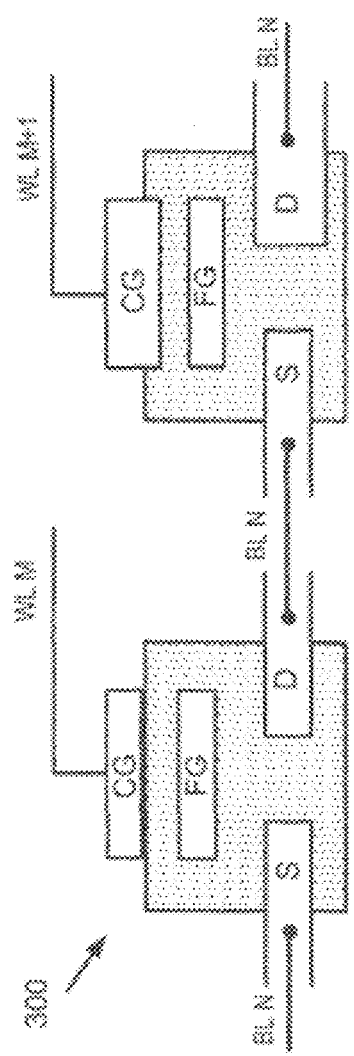
FIG. 3A schematically illustrates a set of memory cells as arranged in a memory device.
Figure 4:
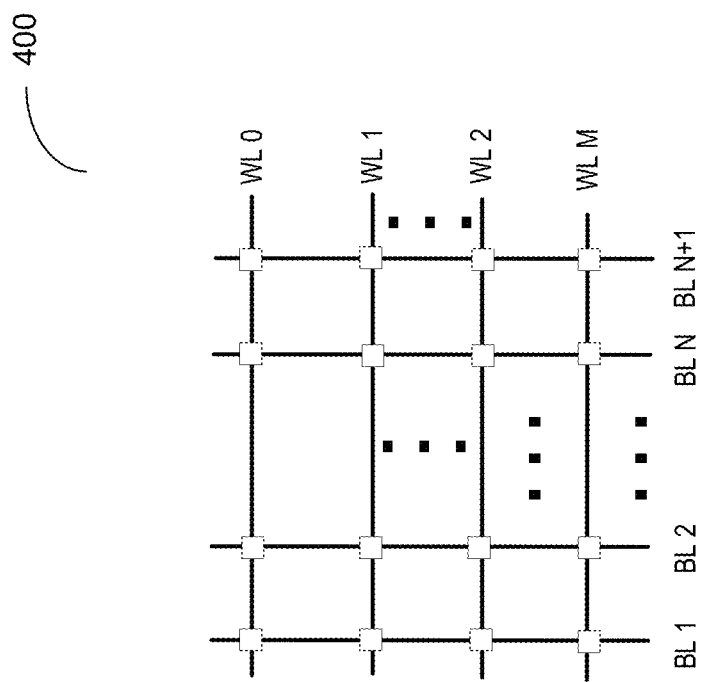
FIG. 4 schematically illustrates an example memory array.

To make a memory cell non-volatile, the cell can be further equipped with a conducting island—a charge storage node—that can be electrically isolated from the control gate, the source electrode, and the drain electrode by insulating layers (depicted in FIG. 3A as the dotted region). In response to an appropriately chosen positive (in relation to the source potential) control gate voltage $V_{CG}$, the charge storage node can receive an electric charge Q, which can be permanently stored thereon even after the power to the memory cell—and, consequently, the source-drain current—is ceased. The charge Q can affect the distribution of threshold voltages $P(V_T, Q)$. Generally, the presence of the electric charge Q shifts the distribution of threshold voltages towards higher voltages, compared with the distribution $P(V_T)$ for an uncharged charge storage node. This happens because a stronger positive control gate voltage $V_{CG}$ can be needed to overcome a negative potential of the charge storage node charge Q. If any charge of a sequence $Q_k$ of charges with $1 \le k \le 2^N$ can be selectively programmed (and later detected during a read operation) into a memory cell, the memory cell can function as an N-bit storage unit. The charges $Q_k$ are preferably selected to be sufficiently different from each other, so that any two adjacent voltage distributions $P(V_T, Q_k)$ and $P(V_T, Q_{k+1})$ do not overlap being separated by a valley margin, so that $2^N$ distributions $P(V_T, Q_k)$ are interspaced with $2^N-1$ valley margins.

Figure 3C:
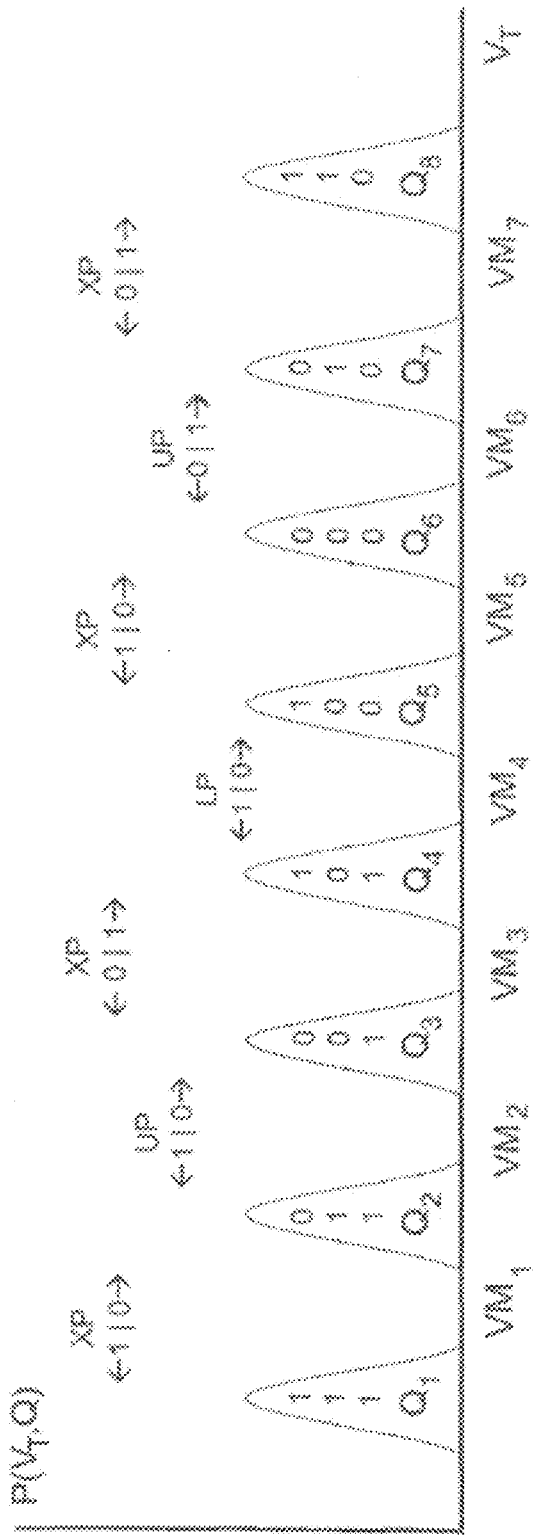
FIG. 3C schematically illustrates an example distribution of threshold control gate voltages for a memory cell.

FIG. 3C illustrates schematically a distribution of threshold control gate voltages for a memory cell capable of storing three bits of data by programming the memory cell into at least eight charge states that differ by the amount of charge on the cell's charge storage node. FIG. 3C shows distributions of threshold voltages $P(V_T, Q_k)$ for $2^N=8$ different charge states of a tri-level cell (TLC) separated with $2^3-1=7$ valley margins $VM_k$. Accordingly, a memory cell programmed into a charge state k-th (i.e., having the charge $Q_k$ deposited on its charge storage node) can be storing a particular combination of N bits (e.g., 0110, for N=4). This charge state $Q_k$ can be determined during a readout operation by detecting that a control gate voltage $V_{CG}$ within the valley margin $VM_k$ is sufficient to open the cell to the source-drain current whereas a control gate voltage within the preceding valley margin $VM_{k-1}$ is not.

Memory devices can be classified by the number of bits stored by each cell of the memory. For example, a single-level cell (SLC) memory has cells that can each store one bit of data (N=1). A multi-level cell (MLC) memory has cells that can each store up to two bits of data (N=2), a tri-level cell (TLC) memory has cells that can each store up to three bits of data (N=3), and a quad-level cell (QLC) memory has cells that can each store up to four bits of data (N=4). In general, the operations described herein can be applied to memory devices having N-bit memory cells, where N>1.

For example, a TLC can be capable of being in one of eight charging states $Q_k$ (where the first state is an uncharged state $Q_1=0$) whose threshold voltage distributions are separated by valley margins $VM_k$ that can be used to read out the data stored in the memory cells. For example, if it is determined during a read operation that a read threshold voltage falls within a particular valley margin of $2^N-1$ valley margins, it can then be determined that the memory cell is in a particular charge state out of $2^N$ possible charge states. By identifying the right valley margin of the cell, it can be determined what values all of its N bits have. The identifiers of valley margins (such as their coordinates, e.g., location of centers and widths) can be stored in a read level threshold register of the memory controller 215.

As noted herein above, the memory controller 215 can program a state of the memory cell and then can read this state by comparing a read threshold voltage $V_T$ of the memory cell against one or more read level thresholds. The read operation can be performed after a memory cell is placed in one of its charged states $Q_k$ by a previous write operation, which can include one or more programming passes. Each programming pass would apply appropriate programming voltages to a given wordline M in order place appropriate charges on the charge storage nodes of the memory cells that are connected to the wordline M.

Figure 5:
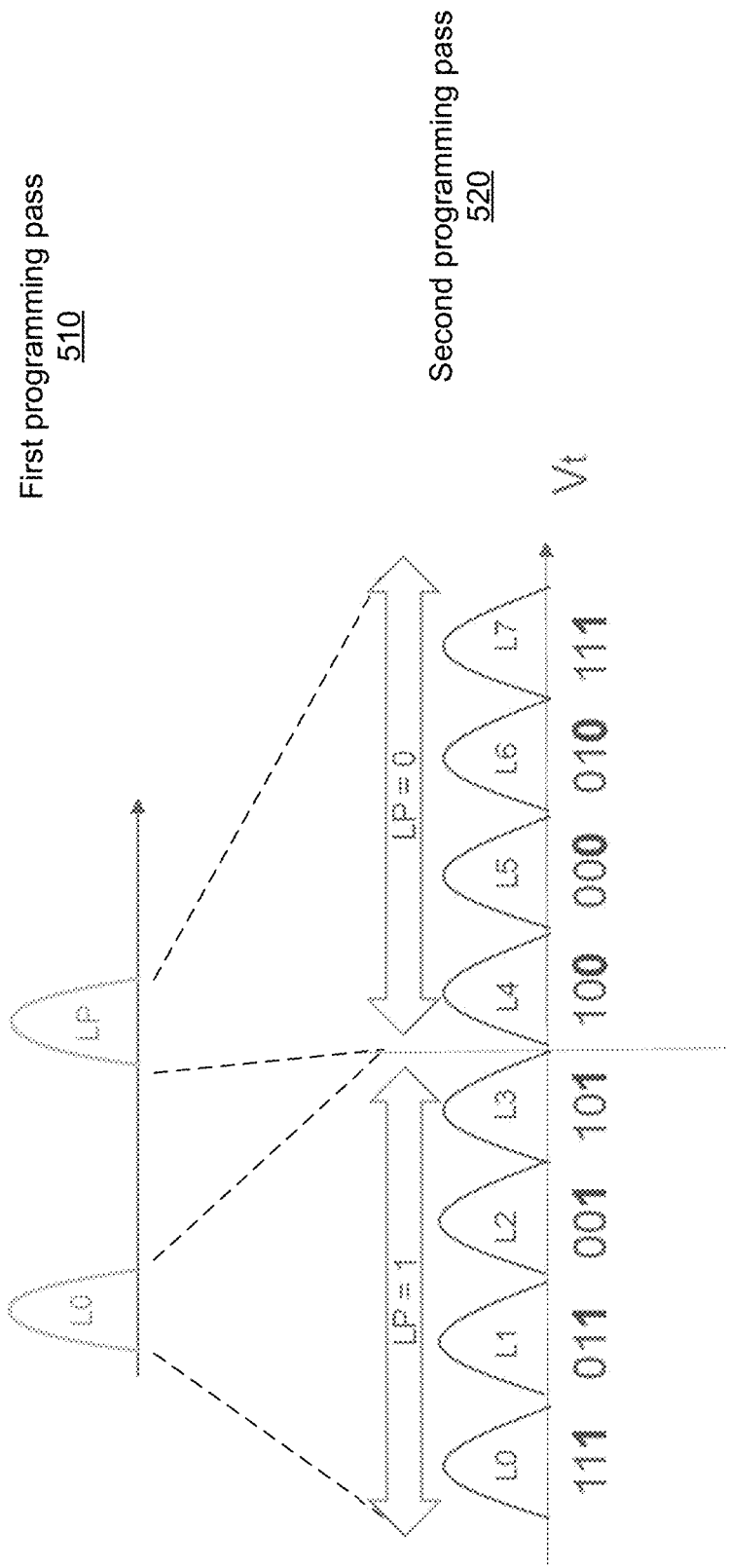
FIG. 5 schematically illustrates a two-pass (2-8) programming operation.

In some embodiments, the memory controller can implement a two pass programming algorithm, which involves programming the lower page (LP) bits of the memory cells by the first programming pass, followed by programming the upper page (UP) bits and the extra page (XP) bits of the memory cells by the second programming pass, as schematically illustrated by FIG. 5. This algorithm can be referred to as 2-8 programming algorithm, to reflect the number of memory cell states programmed by each pass. The first programming pass 510 forms, for each memory cell, two states, L0 and LP. The second programming pass 520 forms, for each memory cell, four states corresponding to each of L0 and LP states. The newly formed states are referred to as L0, L1, L2, and L3 for the original L0 state, and L4, L5, L6, and L7 for the original LP state. Thus, each memory cell stores eight states that are programmable by two sequential programming passes.

Figure 6:
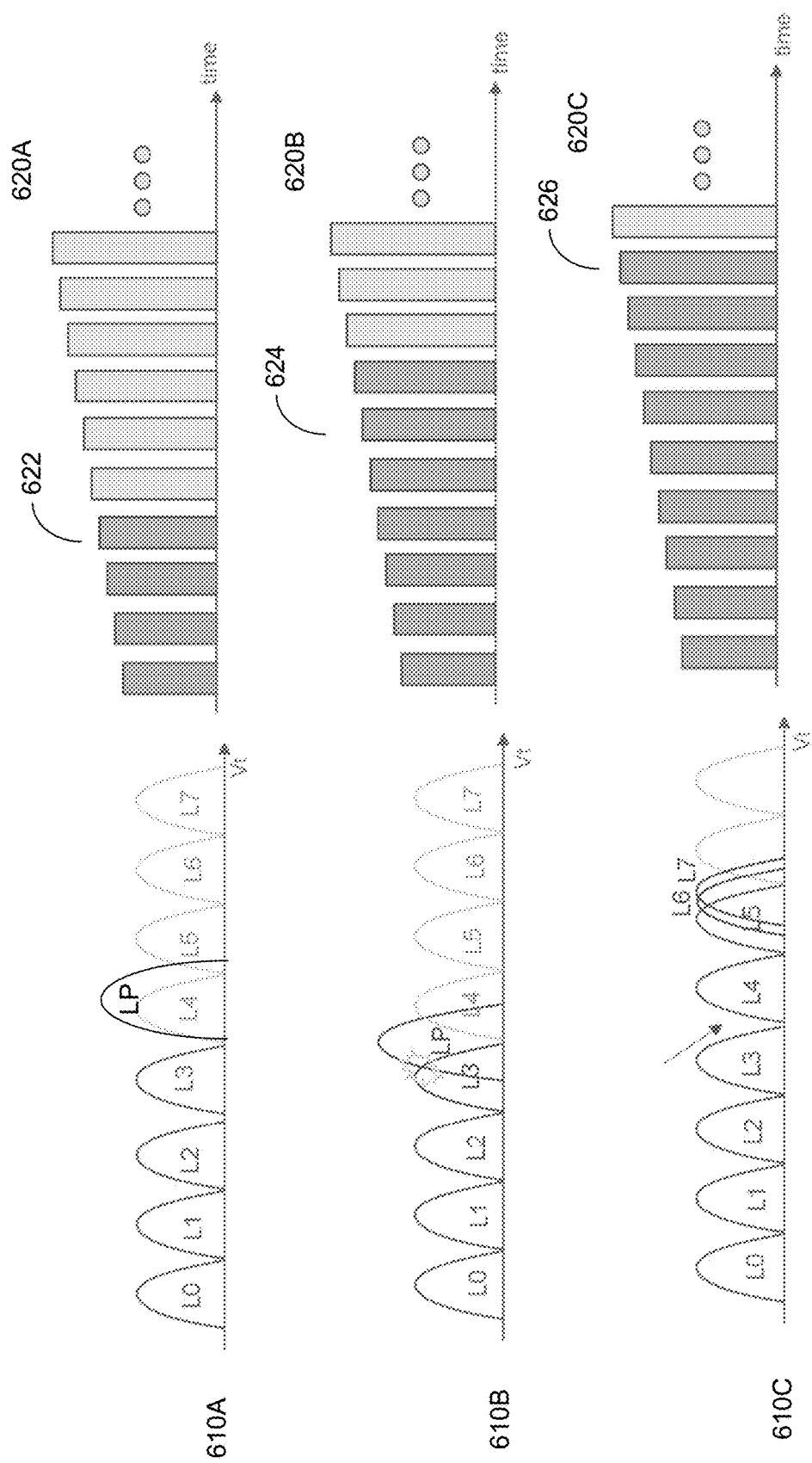
FIG. 6 schematically illustrates threshold voltage distribution created in course of a two-pass programming operation.

By design, the non-volatile memory device is expected to maintain the programmed data irrespectively of the power supply state. However, some implementations of the above-described two pass programming can be susceptible to losing the programmed LP data if a power loss occurs during the second programming pass. As schematically illustrated by FIG. 4, in order to successfully read the LP data, the read algorithm should be able to distinguish the L3 and L4 distributions. However, in some situations, a power loss occurring during the second programming pass can render the L3 and L4 distributions indistinguishable, thus losing the programmed LP data, as schematically illustrated by FIG. 6. Notably, the UP and XP data is still stored by the host during the second programming pass, and thus losing the partly programmed UP and XP data during the second programming pass is acceptable.

A programming operation involves a sequence of programming voltage pulses that are applied to a selected wordline. In the illustrative example of FIG. 6, the programming operation 610A involves applying a sequence of programming passes 620A during the second programming pass. Suppose a power loss happens during the fourth programming pulse 622. By that time, the L0, L1, and L2 distributions have already been formed by the preceding programming pulses, and the L3 distribution is being formed by the programming pulses 622. Since the L3 distribution has not yet been formed, there would be a sufficient margin between the L3 and LP distributions.

Similarly, the programming operation 610C involves applying a sequence of programming passes 620C during the second programming pass. If a power loss happens during the ninth programming pulse 626, by which time the L0, L1, L2, and L3 have been fully formed, and the L4-L7 distributions are being formed, thus providing a sufficient margin between the L3 and L4 distributions. There may be some overlap between some of the L4-L7 distributions, but since all of them have the LP bit equal to zero, the LP data would still be preserved irrespectively of possible overlaps between the L4-L7 distributions.

However, the example programming operation 610B, which involves applying a sequence of programming passes 620B during the second programming pass, may lead to an irrecoverable loss of the LP data due to the LP distribution becoming undistinguishable from the L3 distribution. The issue can be caused by the phenomenon known as the "slow charge loss," which refers to the electric charge of a given memory cell diminishing due to the loss of electrons, which causes the voltage thresholds to shift along the voltage axis towards lower voltage thresholds $V_T$. The threshold voltages can change rapidly at first (immediately after the memory cell is programmed) while slowing down at larger times in an approximately power-law fashion, $\Delta V_T(t)=-C*t^b$, with respect to the time t elapsed since the cell programming event. The slow charge loss can cause the LP distribution to slowly move down, thus contributing to the overlap of L3 and LP distributions. Thus, the issue visibly manifests itself when there is a long delay between the first and second programming passes causing the greater slow charge loss. During the fifth-seven programming pulses 624, the L3 distribution has been fully formed, while the LP distribution may have been moved down due to the slow charge loss, thus resulting in L3-LP overlap, which renders the LP distribution undistinguishable from the L3 distribution and leads to unrecoverable loss of the LP data.

Accordingly, in order to maintain LP data through an asynchronous power loss event occurring during the second programming pass, the programming algorithm can be modified to cause the LP distribution to move ahead of the L3 distribution. As noted herein above, each programming pass applies appropriate programming voltages to a given wordline M in order place appropriate charges on the charge storage nodes of the selected memory cells that are connected to the wordline M. In order to provide a distinguishable valley between the L3 and LP distributions, different voltage levels can be applied to L0-L3 and L4-L7 bits during the second programming pass. It may also be desirable to program the LP distribution to a lower PV (program verify) level in order to speed up the programming time of the first pass programming operation.

Referring again to FIG. 3A, the source (S) and drain (D) electrodes of a memory cell can be connected to a conductive bitline shared by multiple memory cells. A programming operation would apply a sequence of programming voltage pulses to the control gate (CG) via a corresponding wordline (WL). Each programming voltage pulse would induce an electric field that would pull the electrons onto the charge storage node. Applying a relatively small voltage on the bitline would effectively decrease the electric field strength, which would in turn slow down the rate at which the electrons would be accumulated on the charge storage node. Accordingly, during the second programming pass an bias voltage can be applied to the bitlines coupled to the memory cells that are in TLC levels L0-L3 (corresponding to LP=1), thus resulting in slightly lower threshold voltage levels for the L0-L3 bits. No bias voltage is needed for the bitlines that are to be programmed to TLC levels L4-L7 (corresponding to LP=0); accordingly, those bitlines should remain at ground during the programming operation.

The voltage applied to the bitlines coupled to the memory cells that are in TLC levels L0-L3 will slightly inhibit those cells during programming, making them slower to program than memory cells that are in levels L4-L7, which would have their bitlines grounded. During the second programming pass, this will create an extra separation between the forming L3 and L4 distributions. The margin between the L3 and L4 distributions can be modulated by the amount of the voltage applied, during the second programming pass, to the bitlines that are coupled to the memory cells that are in TLC levels L0-L3.

Thus, a programming operation can involve sequentially applying programming voltage pulses to a selected wordline, while bias voltage values are applied to certain bitlines, depending on the state of the page buffer latches which store the bit values read from the memory cells. In some implementations, the programming pulse voltage can be sequentially incremented from the initial voltage value (e.g., 0V) to the final voltage value (e.g., $V_{MAX}$). The unselected wordlines for the remaining cells can, during the programming operation, be biased at a certain voltage, e.g., a passthrough voltage, which is less than the programming voltage.

After each programming pulse is applied to the selected wordline, a verify operation can be performed by reading the memory cell in order to determine whether the threshold voltage $V_T$ of the memory cell has reached a desired value (voltage verify level). If the threshold voltage $V_T$ of the memory cell has reached the verify voltage associated with the desired state, the bitline to which the memory cell is connected can be biased at the program inhibit voltage, thus inhibiting the memory cells that are coupled to the bitline from being further programmed, i.e., to prevent the threshold voltage $V_T$ of the memory cells from shifting further upward in response to subsequent programming pulses applied to the selected wordline.

During the second programming pass, a bias voltage can be applied to the bitlines coupled to the memory cells that are in TLC levels 1, 2, and 3 (corresponding to LP=1), thus resulting in slightly lower threshold voltage levels after each programming pulse for the L0-L3 bits. No bias voltage is needed for the bitlines that are to be programmed to TLC levels 4, 5, 6, and 7 (corresponding to LP data=0); accordingly, those bitlines should remain at ground during the programming operation.

Figure 7:
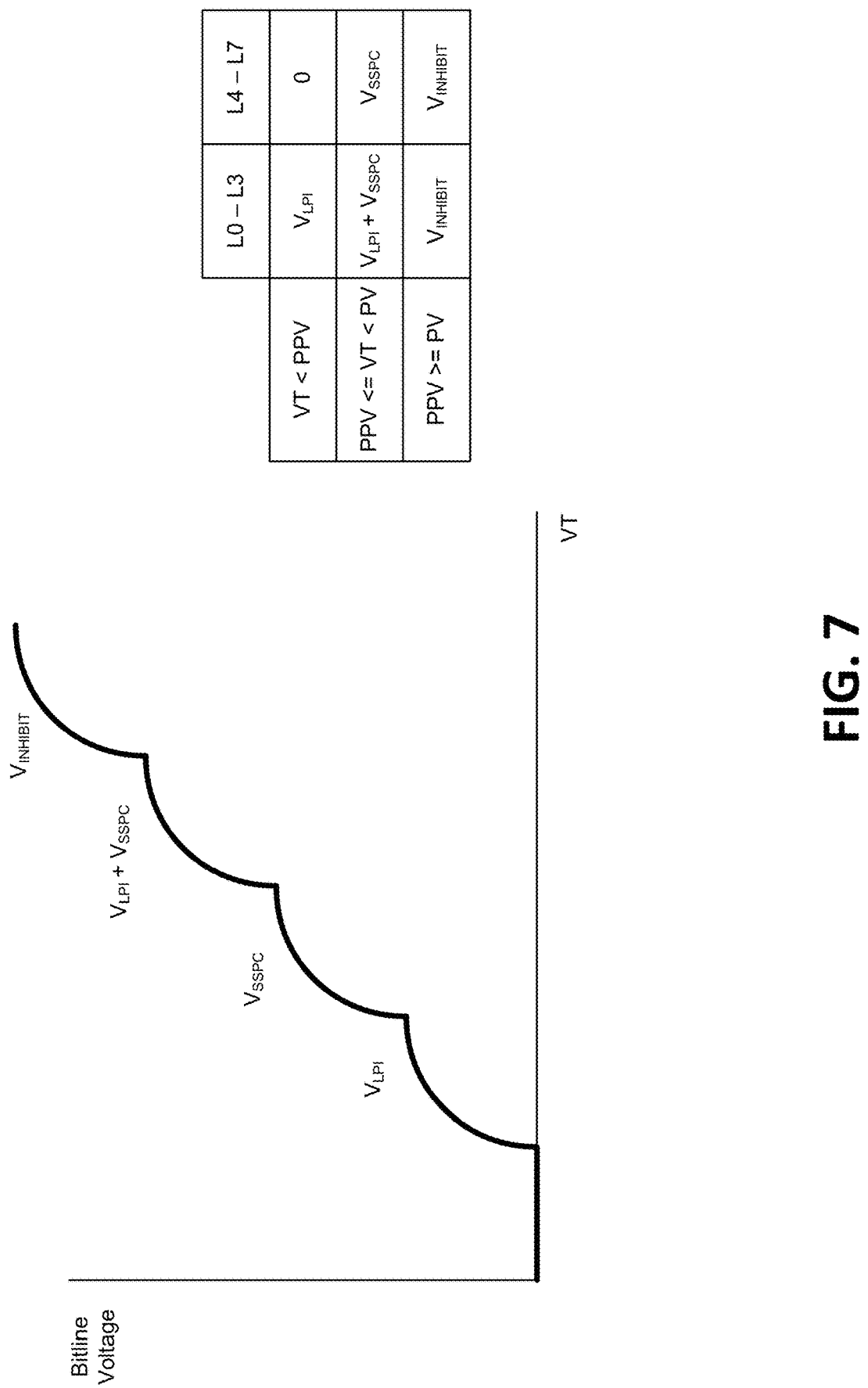
FIG. 7 schematically illustrates bias voltages to be applied to various bitlines for providing the lower page (LP) protection, in accordance with embodiments of the present disclosure.

As schematically illustrated by FIG. 7, the bias voltage to be applied to the bitlines can be set to the following values:

zero (0V) voltage can be applied to bitlines at levels L4-L7 (corresponding to LP=0) and the threshold voltage ($V_T$) below the pre-program verify voltage (PPV). It should be noted that there may be multiple pre-program verify levels corresponding to L4-L7 levels;

the lower page immunity level ($V_{LPI}$) voltage can be applied to bitlines at levels L0-L3 (corresponding to LP=1) and the threshold voltage ($V_T$) below the pre-program verify voltage (PPV);

the selective slow programming convergence ($V_{SSPC}$) voltage can be applied to bitlines with LP=0 (levels L4-L7) and the threshold voltage ($V_T$) between the pre-program verify voltage (PPV) and the programming voltage (PV);

the voltage level equal to the sum of the lower page immunity level voltage and the slow programming convergence voltage (which should be higher than the sum ($V_{LPI}$+$V_{SSPC}$)) can be applied to bitlines with LP=1 (levels L0-L3) and the threshold voltage ($V_T$) between the pre-program verify voltage level (PPV) and the programming voltage (PV); and the inhibit level ($V_{INHIBIT}$) voltage can be applied to bitlines with the threshold voltage ($V_T$) exceeding the programming voltage (PV).

Figure 8:
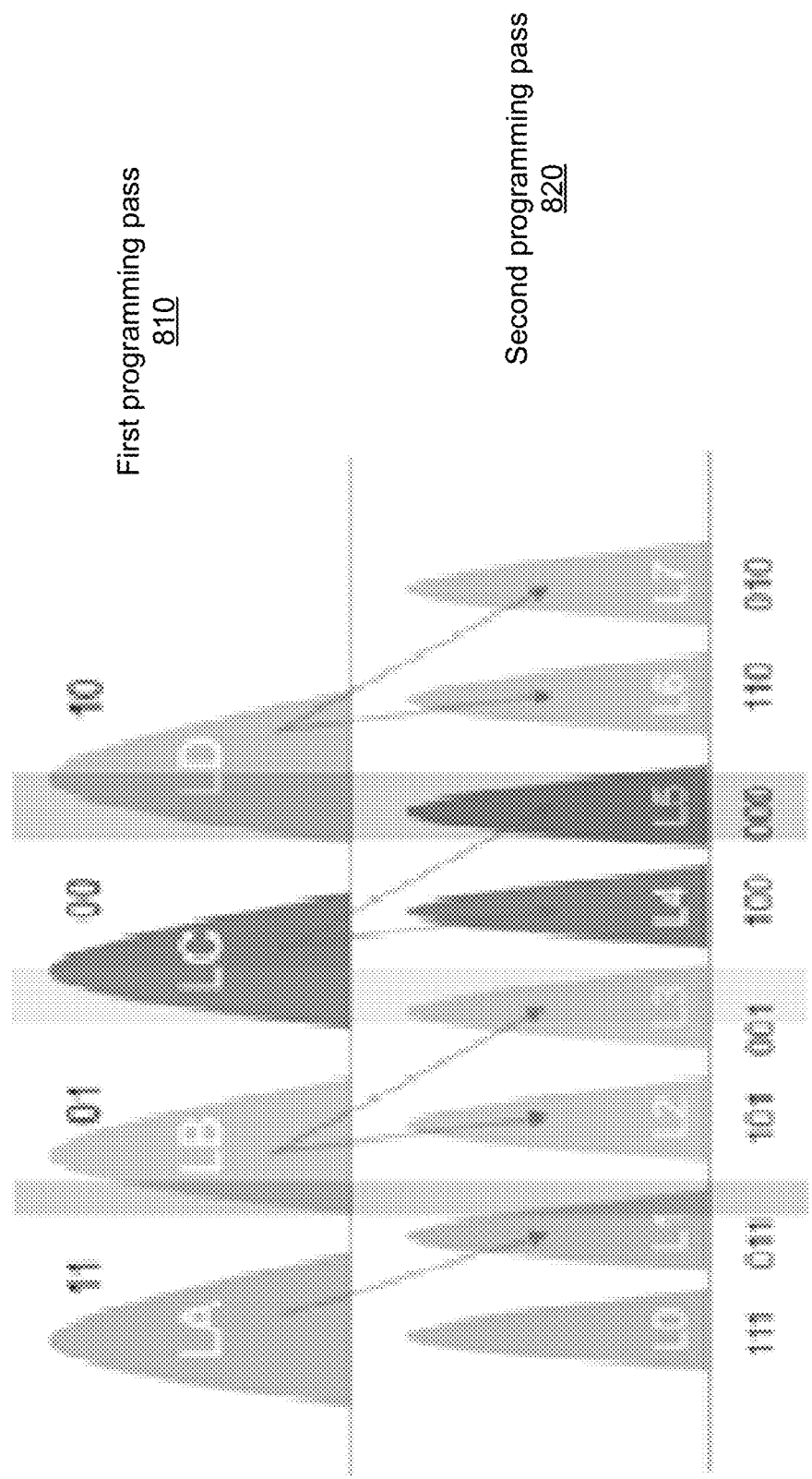
FIG. 8 schematically illustrates a two-pass (4-8) programming operation.

In some embodiments, the memory controller can implement a two pass programming algorithm, which involves programming the lower page (LP) and upper page (UP) bits of the memory cells by the first programming pass, followed by programming the extra page (XP) bits of the memory cells by the second programming pass as schematically illustrated by FIG. 8. This algorithm can be referred to as 4-8 programming algorithm, to reflect the number of memory cell states programmed by each pass. The first programming pass 810 forms, for each memory cell, four states, LA, LB, LC, and LD. The second programming pass 820 forms, for each memory cell, two states corresponding to each of LA, LB, LC, and LD. The newly formed states are referred to as L0 and L1 for the original LA state, L2 and L3 for the original LB state, L4 and L5 for the original LC state, and L6 and L7 for the original LD state. Thus, each memory cell stores eight states that are programmable by two sequential programming passes.

Some implementations of the above-described two pass programming can be susceptible to losing the programmed LP data if a power loss occurs during the second programming pass. Similarly to the above-described embodiment utilizing the 2-8 programming algorithm, the 4-8 programming algorithm can be modified in order to maintain the LP and UP data through an asynchronous power loss event that may occur during the second programming pass. The modified programming algorithm can apply an bias voltage to certain bitlines in order to slightly inhibit the memory cells during programming, thus creating extra separation between the threshold voltage distributions. The margins between the L1 and LB distributions, the L3 and LC distributions, and the L5 and LD distributions can be modulated by the amount of the voltage applied to the bitlines that are coupled to the memory cells that are in TLC levels L1, L35, and L5.

As schematically illustrated by FIG. 8, in order to successfully read the LP and UP data, the read algorithm should be able to distinguish the L1 distribution from the LB distribution, the L3 distribution from the LC distribution, and the L5 distribution from the LD distribution. In order to distinguish the L1 distribution from the LB distribution, the programming operation should slow down the L1 distribution with respect to the L2 and L3 distributions. However, before the L3 distribution would overlap with the LC distribution, the L3 distribution needs to be slowed down with respect to the L4 and L5 distributions. Furthermore, before the L5 distribution would overlap with the LD distribution, the L5 distribution needs to be slowed down with respect to the L6 and L7 distributions.

Figure 9:
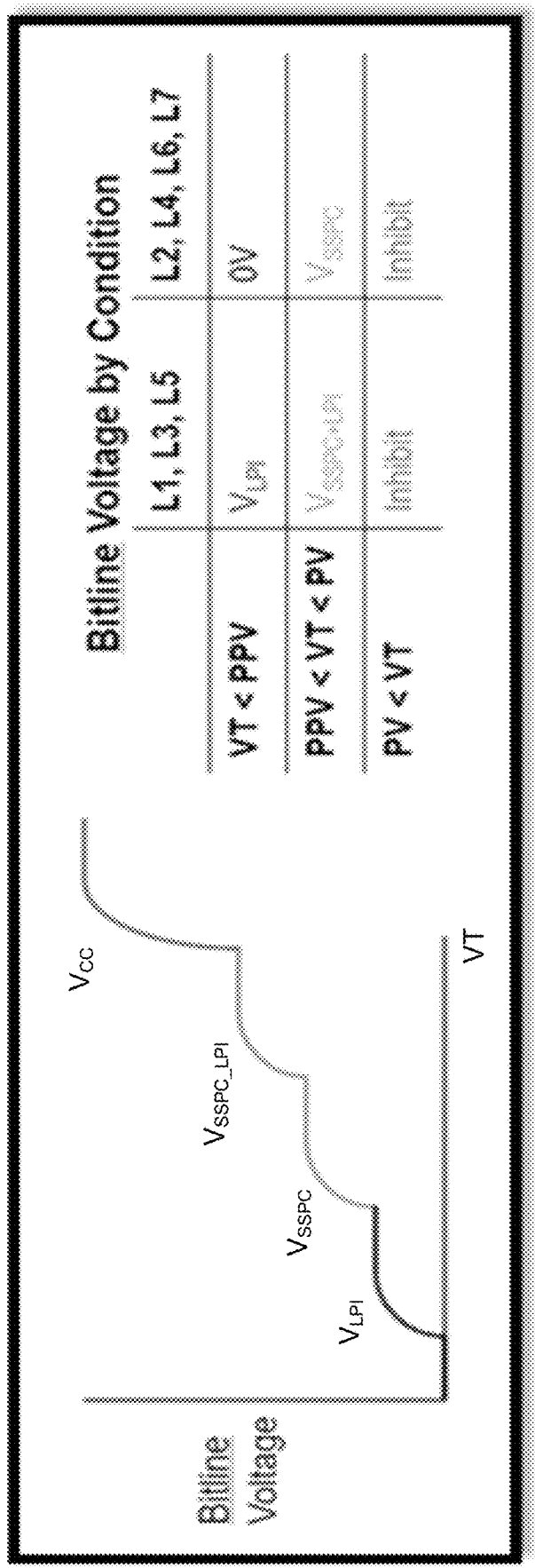
FIG. 9 schematically illustrates bias voltages to be applied to various bitlines for providing the lower page (LP) and upper page (UP) protection, in accordance with embodiments of the present disclosure.

As schematically illustrated by FIG. 9, the bias voltage to be applied to the bitlines at levels L2, L4, L6, and L7 can be set to the following values:

zero (0V) voltage can be applied to bitlines with the threshold voltage ($V_T$) below the pre-program verify voltage (PPV);

the slow programming convergence ($V_{SSPC}$) voltage can be applied to bitlines with the threshold voltage ($V_T$) between the pre-program verify voltage (PPV) and the programming voltage (PV). It should be noted that the selective slow programming convergence ($V_{SSPC}$) voltage can be applied or not applied to any level. For example, $V_{SSPC}$ can be disabled for L7 but enabled for all other levels; and the inhibit level (Vim-mu) voltage can be applied to bitlines with the threshold voltage ($V_T$) exceeding the programming voltage (PV).

Furthermore, the bias voltage to be applied to the bitlines at levels L1, L3, and L5 can be set to the following values:

zero (0V) voltage can be applied to bitlines with the threshold voltage ($V_T$) below the level N−1 programming voltage ($PV_{N-1}$). Level N−1 is the previous level with respect to the current level. For example, $PV_{N-1}$ for L3 is the L2 programming voltage (PV);

the lower page immunity level ($V_{LPI}$) voltage can be applied to bitlines at levels L1, L3, and L5 and the threshold voltage ($V_T$) between the level N−1 programming voltage ($PV_{N-1}$) and the pre-program verify voltage (PPV);

the voltage level equal to the sum of the lower page immunity level voltage and the slow programming convergence voltage ($V_{LPI}+V_{SSPC}$) can be applied to bitlines at levels L1, L3, and L5 and the threshold voltage ($V_T$) between the pre-program verify voltage level (PPV) and the programming voltage (PV); and the inhibit level ($V_{INHIBIT}$) voltage can be applied to bitlines with the threshold voltage ($V_T$) exceeding the programming voltage (PV).

The above-referenced voltage levels, including the programming voltage (PV), the pre-program verify voltage (PPV), the lower page immunity level ($V_{LPI}$), and the slow programming convergence ($V_{SSPC}$) voltage, can be selected from a known voltage range (e.g., 0-20V) by performing a series of tests in order to determine the voltage levels that achieve the desired characteristics of the resulting voltage distributions of the programmed memory cells, i.e., to provide a sufficient margin between the L3 and L4 distributions of the programmed memory cells.

While the above-described examples are directed to TLC programming algorithms, the systems and methods of the present disclosure can be similarly applied to MLC, QLC, and other algorithms utilized for programming memory cells that are capable of storing one or more data bits.

Figure 10:
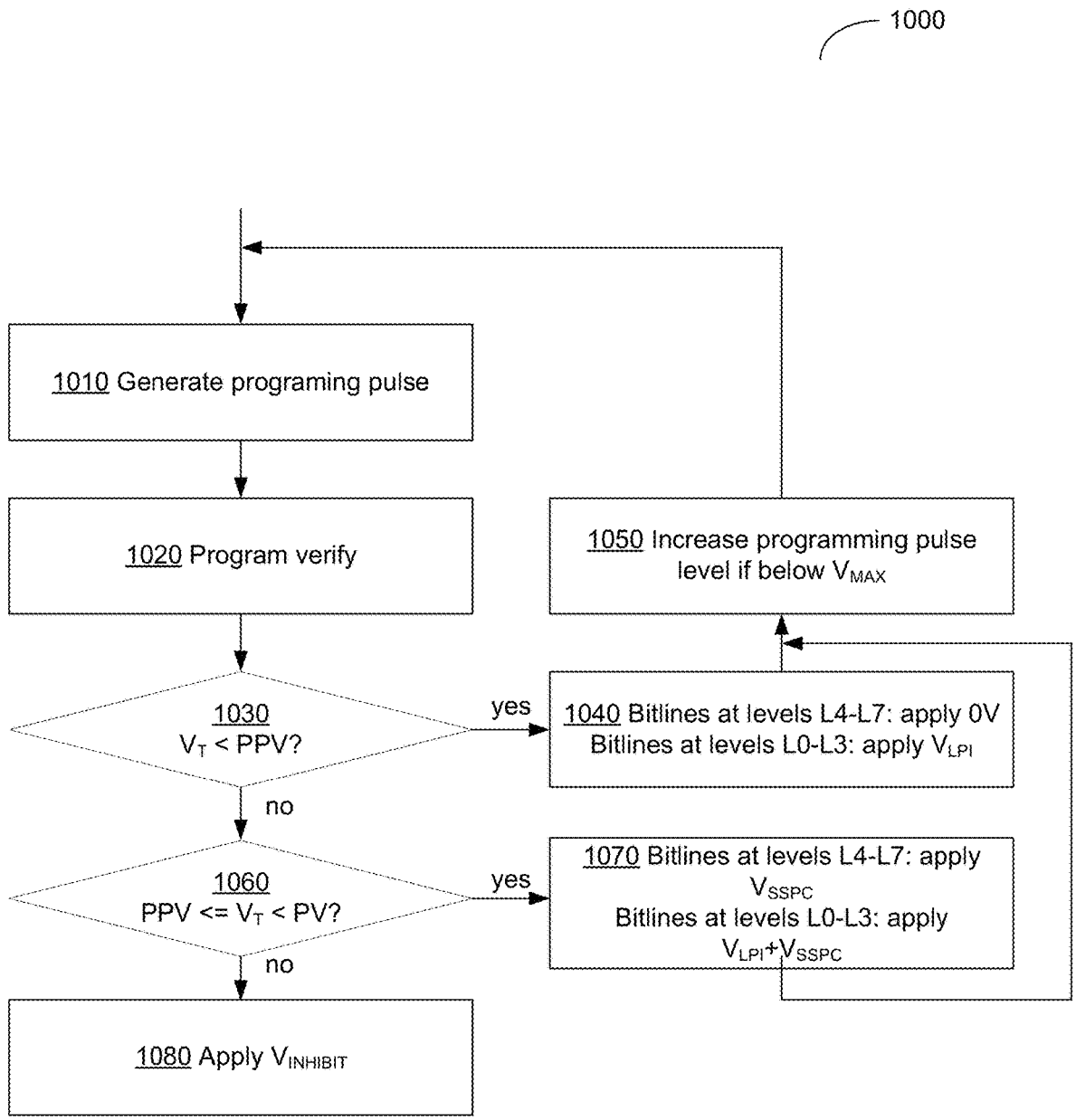
FIG. 10 is a flow diagram of an example method of performing a memory programming operation in a manner preserving the lower page (LP) immunity, in accordance with embodiments of the present disclosure.

FIG. 10 is a flow diagram of an example method of performing a memory programming operation in a manner preserving the LP immunity, in accordance with embodiments of the present disclosure. The method 1000 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1000 is performed by the memory sub-system controller 115 and/or the local media controller 135 of FIG. 1. Although shown in a particular sequence or order, unless otherwise specified, the order of the operations can be modified. Thus, the illustrated embodiments should be understood only as examples, and the illustrated operations can be performed in a different order, and some operations can be performed in parallel. Additionally, one or more operations can be omitted in various embodiments. Thus, not all operations are required in every embodiment.

At operation 1010, the controller generates a programming pulse and applies the programming pulse to a selected wordline of the memory device.

At operation 1020, the controller performs a program verify operation by reading one or more memory cells to which the programming pulse has been applied, in order to determine whether the threshold voltage $V_T$ of the memory cells has reached a desired value.

Responsive to determining, at operation 1030, that the threshold voltage $V_T$ is below the program verify voltage (PPV), the controller, at operation 1040, applies 0V to the bitlines at levels L4-L7. The controller further applies $V_{PLI}$ bias voltage to the bitlines at levels L0-L3. Responsive to applying the bias voltage, the controller, at operation 1050, increases the programming pulse level until it reaches the maximum programming level $V_{MAX}$, and generates the next programming pulse at operation 1010.

Otherwise, responsive to determining, at operation 1060, that the threshold voltage $V_T$ is between the program verify voltage (PPV) and the program voltage level, the controller, at operation 1070, applies the slow programming convergence voltage ($V_{SSPC}$) to bitlines at levels L4-L7. It should be noted that the selective slow programming convergence ($V_{SSPC}$) voltage can be applied or not applied to any level. For example, $V_{SSPC}$ can be disabled for L7 but enabled for all other levels. The controller further applies the voltage level equal to the sum of the lower page immunity level voltage and the slow programming convergence voltage ($V_{LPI}+V_{SSPC}$) to bitlines at levels L0-L3. Responsive to applying the bias voltage, the controller, at operation 1050, increases the programming pulse level until it reaches the maximum programming level $V_{MAX}$, and generates the next programming pulse at operation 1010.

At operation 1080, the threshold voltage $V_T$ exceeds program verify voltage (PPV). Accordingly, the controller applies the inhibit voltage level ($V_{INHIBIT}$) to all bitlines. It should be noted that even if some bitlines are inhibited, programming pulses can still be issued, since the bits are programmed in groups of pages: when some bitlines are inhibited, other bitlines can be programmed.

Figure 11:
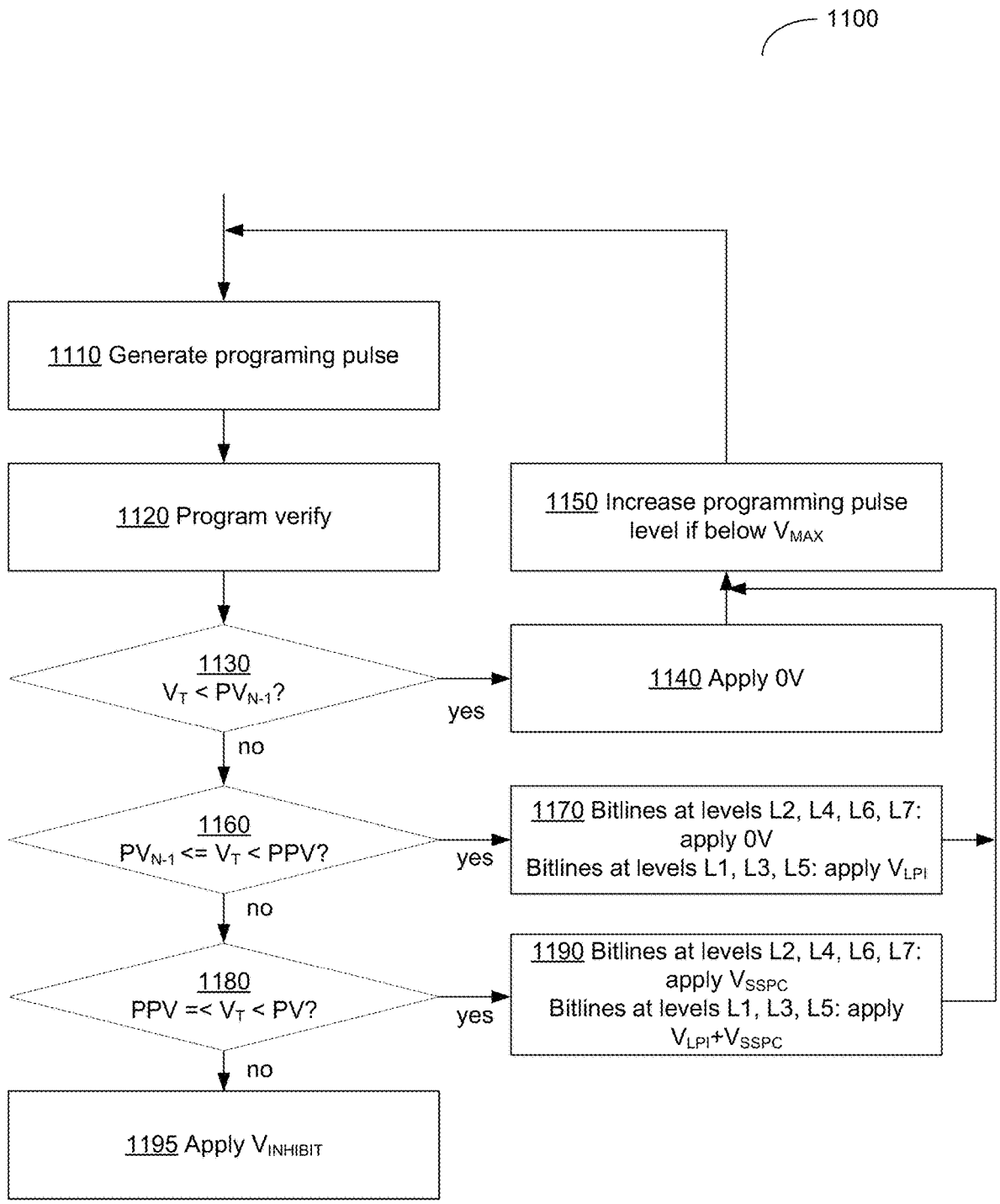
FIG. 11 is a flow diagram of an example method of performing a memory programming operation in a manner preserving the lower page (LP) and upper page (UP) immunity, in accordance with embodiments of the present disclosure.

FIG. 11 is a flow diagram of an example method of performing a memory programming operation in a manner preserving the LP and UP immunity, in accordance with embodiments of the present disclosure. The method 1100 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1100 is performed by the memory sub-system controller 115 and/or the local media controller 135 of FIG. 1. Although shown in a particular sequence or order, unless otherwise specified, the order of the operations can be modified. Thus, the illustrated embodiments should be understood only as examples, and the illustrated operations can be performed in a different order, and some operations can be performed in parallel. Additionally, one or more operations can be omitted in various embodiments. Thus, not all operations are required in every embodiment.

At operation 1110, the controller generates a programming pulse and applies the programming pulse to a selected wordline of the memory device.

At operation 1120, the controller performs a program verify operation by reading one or more memory cells to which the programming pulse has been applied, in order to determine whether the threshold voltage $V_T$ of the memory cells has reached a desired value.

Responsive to determining, at operation 1130, that the threshold voltage $V_T$ is below the level N-1 programming voltage ($PV_{N-1}$), the controller, at operation 1140, applies 0V to all bitlines. Responsive to applying the bias voltage, the controller, at operation 1150, increases the programming pulse level until it reaches the maximum programming level $V_{MAX}$, and generates the next programming pulse at operation 1111.

Responsive to determining, at operation 1160, that the threshold voltage $V_T$ is between the level N-1 programming voltage ($PV_{N-1}$) and the program verify voltage (PPV), the controller, at operation 1170, applies 0V to the bitlines at levels L2, L4, L6, and L7. The controller further applies $V_{PLI}$ bias voltage to the bitlines at levels L1, L3, and L5. Responsive to applying the bias voltage, the controller, at operation 1150, increases the programming pulse level until it reaches the maximum programming level $V_{MAX}$, and generates the next programming pulse at operation 1111.

Responsive to determining, at operation 1180, that the threshold voltage $V_T$ is between the program verify voltage (PPV) and the program voltage level (PV), the controller, at operation 1190, applies the slow programming convergence voltage ($V_{SSPC}$) to bitlines at levels at levels L2, L4, L6, and L7. It should be noted that the selective slow programming convergence ($V_{SSPC}$) voltage can be applied or not applied to any level. For example, $V_{SSPC}$ can be disabled for L7 but enabled for all other levels. The controller further applies the voltage level equal to the sum of the lower page immunity level voltage and the slow programming convergence voltage ($V_{LPI}+V_{SSPC}$) to bitlines at levels L1, L3, and L5.

Responsive to applying the bias voltage, the controller, at operation 1150, increases the programming pulse level until it reaches the maximum programming level $V_{MAX}$, and generates the next programming pulse at operation 1110.

Operation 1195 is performed if the threshold voltage $V_T$ exceeds program verify voltage (PPV). Accordingly, the controller applies the inhibit voltage level ($V_{INHIBIT}$) to all bitlines. It should be noted that even if some bitlines are inhibited, programming pulses can still be issued, since the bits are programmed in groups of pages: when some bitlines are inhibited, other bitlines can be programmed.

Figure 12:
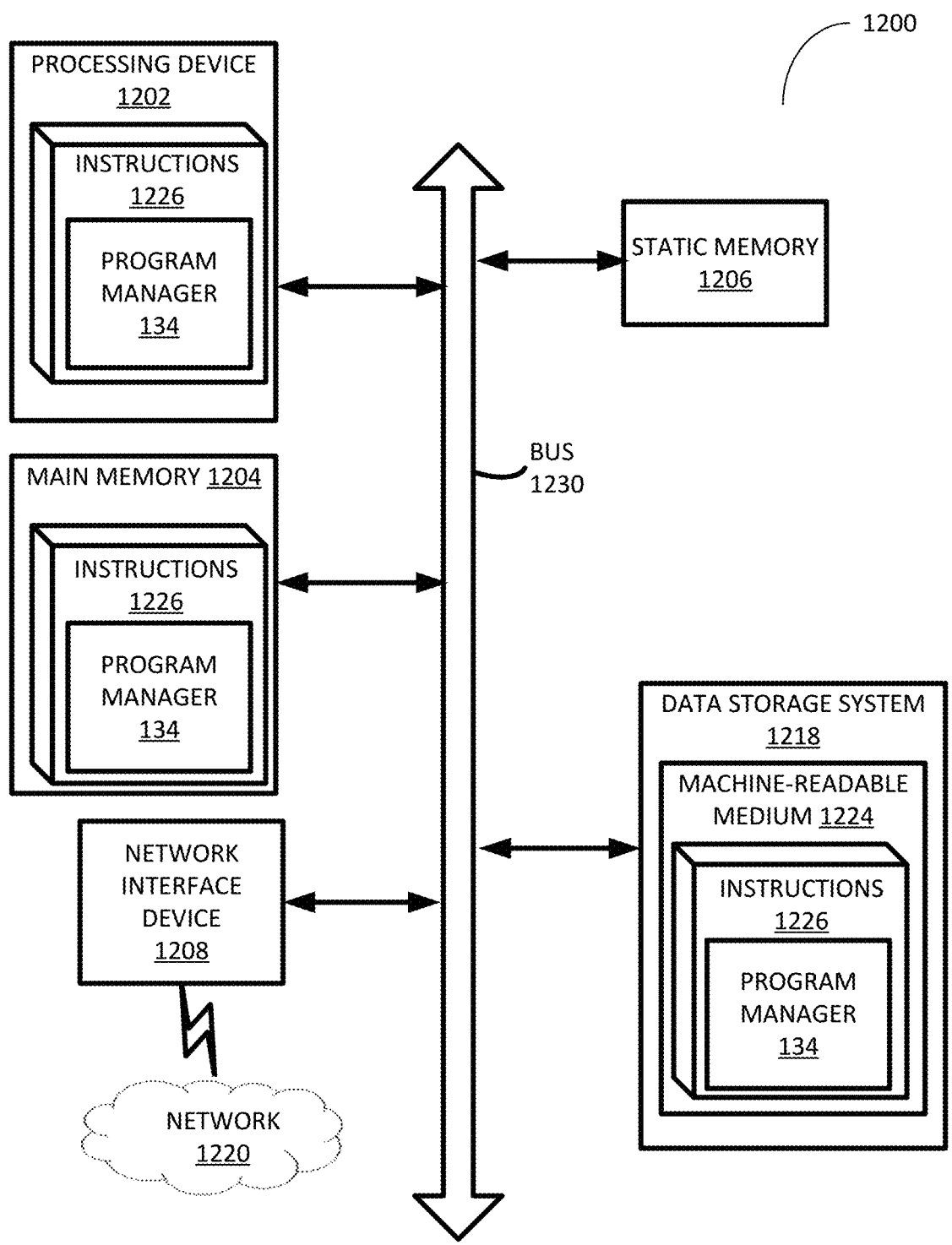
FIG. 12 is a block diagram of an example computer system in which embodiments of the present disclosure can operate.

FIG. 12 illustrates an example machine of a computer system 1200 within which a set of instructions, for causing the machine to perform any one or more of the methodologies discussed herein, can be executed. In some embodiments, the computer system 1200 can correspond to a host system (e.g., the host system 120 of FIG. 1) that includes, is coupled to, or utilizes a memory sub-system (e.g., the memory sub-system 120 of FIG. 1) or can be used to perform the operations of a controller (e.g., to execute an operating system to perform operations corresponding to programming manager 134 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1200 includes a processing device 1202, a main memory 1204 (e.g., read-only memory (ROM), flash memory, dynamic random access memory (DRAM) such as synchronous DRAM (SDRAM) or Rambus DRAM (RDRAM), etc.), a static memory 1206 (e.g., flash memory, static random access memory (SRAM), etc.), and a data storage system 1218, which communicate with each other via a bus 1230.

Processing device 1202 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1202 can also be one or more special-purpose processing devices such as an application specific integrated circuit (ASIC), a field programmable gate array (FPGA), a digital signal processor (DSP), network processor, or the like. The processing device 1202 is configured to execute instructions 1226 for performing the operations and steps discussed herein. The computer system 1200 can further include a network interface device 1208 to communicate over the network 1220.

The data storage system 1218 can include a machine-readable storage medium 1224 (also known as a computer-readable medium, such as a non-transitory computer-readable medium) on which is stored one or more sets of instructions 1226 or software embodying any one or more of the methodologies or functions described herein. The instructions 1226 can also reside, completely or at least partially, within the main memory 1204 and/or within the processing device 1202 during execution thereof by the computer system 1200, the main memory 1204 and the processing device 1202 also constituting machine-readable storage media. The machine-readable storage medium 1224, data storage system 1218, and/or main memory 1204 can correspond to the memory sub-system 120 of FIG. 1.

In one embodiment, the instructions 1226 include instructions to implement functionality corresponding to programming manager 134 of FIG. 1). While the machine-readable storage medium 1224 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device, comprising:
   a memory array comprising a plurality of memory cells electrically coupled to a plurality of wordlines and a plurality of bitlines; and
   a controller coupled to the memory array, the controller to perform operations comprising:
   causing a programming pulse to be applied to one or more wordlines of the memory array;
   responsive to determining that a threshold voltage of one or more memory cells of the memory array has reached a pre-program verify level, causing a first bias voltage level equal to a selective slow programming convergence voltage level to be applied to a first subset of bitlines of the memory array and causing a second bias voltage level to be applied to a second subset of bitlines of the memory array.

2. The memory device of claim 1, wherein the first subset of bitlines are coupled to memory cells charged to a first subset of logical levels and wherein the second subset of bitlines are coupled to memory cells charged to a second subset of logical levels.

3. The memory device of claim 1, wherein the second bias voltage level is a lower page immunity voltage.

4. The memory device of claim 1, wherein the operations further comprise:
   responsive to determining that the threshold voltage of the one or more memory cells of the memory array is below the pre-program verify level, causing a third bias voltage level to be applied to a first subset of bitlines of the memory array and causing a fourth bias voltage level to be applied to a second subset of bitlines of the memory array.

5. The memory device of claim 4, wherein the third bias voltage level is zero.

6. The memory device of claim 5, wherein the fourth bias voltage level is a lower page immunity voltage.

7. The memory device of claim 1, wherein the operations further comprise:
responsive to determining that the threshold voltage of the one or more memory cells of the memory array is between a predefined voltage and the pre-program verify level, causing a third bias voltage level to be applied to a first subset of bitlines of the memory array and causing a fourth bias voltage level to be applied to a second subset of bitlines of the memory array.

8. The memory device of claim 7, wherein the third bias voltage level is zero.

9. The memory device of claim 7, wherein the fourth bias voltage level is a lower page immunity voltage.

10. The memory device of claim 1, wherein the operations further comprise:
responsive to determining that the threshold voltage of the one or more memory cells of the memory array has reached a program voltage level, causing an inhibit voltage to be applied to the first subset of bitlines and the second subset of bitlines.

11. A computer-readable non-transitory storage medium comprising executable instructions that, when executed by a processing device of a controller managing a memory device, cause the processing device to:
cause a programming pulse to be applied to one or more wordlines of the memory device; and
responsive to determining that a threshold voltage of one or more memory cells of the memory device has reached a pre-program verify level, cause a first bias voltage level equal to a selective slow programming convergence voltage level to be applied to a first subset of bitlines of the memory device and cause a second bias voltage level to be applied to a second subset of bitlines of the memory device.

12. The computer-readable non-transitory storage medium of claim 11, wherein the first subset of bitlines are coupled to memory cells charged to a first subset of logical levels and wherein the second subset of bitlines are coupled to memory cells charged to a second subset of logical levels.

13. The computer-readable non-transitory storage medium of claim 11, further comprising executable instructions that, when executed by the processing device, cause the processing device to:
responsive to determining that the threshold voltage of the one or more memory cells of the memory device is below the pre-program verify level, cause a third bias voltage level to be applied to a first subset of bitlines of the memory device and cause a fourth bias voltage level to be applied to a second subset of bitlines of the memory device.

14. The computer-readable non-transitory storage medium of claim 11, executable instructions that, when executed by the processing device, cause the processing device to:
responsive to determining that the threshold voltage of the one or more memory cells of the memory device is between a predefined voltage and the pre-program verify level, cause a third bias voltage level to be applied to a first subset of bitlines of the memory device and cause a fourth bias voltage level to be applied to a second subset of bitlines of the memory device.

15. The computer-readable non-transitory storage medium of claim 11, further comprising executable instructions that, when executed by the processing device, cause the processing device to:
responsive to determining that the threshold voltage of the one or more memory cells of the memory device has reached a program voltage level, cause an inhibit voltage to be applied to the first subset of bitlines and the second subset of bitlines.

16. A method, comprising:
causing, by a processing device of a controller managing a memory device, a programming pulse to be applied to one or more wordlines of the memory device; and
responsive to determining that a threshold voltage of one or more memory cells of the memory device has reached a pre-program verify level:
causing a first bias voltage level equal to a selective slow programming convergence voltage level to be applied to a first subset of bitlines of the memory device and
causing a second bias voltage level to be applied to a second subset of bitlines of the memory device.

17. The method of claim 16, further comprising:
responsive to determining that the threshold voltage of the one or more memory cells of the memory device is below the pre-program verify level, causing a third bias voltage level to be applied to a first subset of bitlines of the memory device and causing a fourth bias voltage level to be applied to a second subset of bitlines of the memory device.

18. The method of claim 16, further comprising:
responsive to determining that the threshold voltage of the one or more memory cells of the memory device is between a predefined voltage and the pre-program verify level, causing a third bias voltage level to be applied to a first subset of bitlines of the memory device and causing a fourth bias voltage level to be applied to a second subset of bitlines of the memory device.

19. The method of claim 16, further comprising:
responsive to determining that the threshold voltage of the one or more memory cells of the memory device has reached a program voltage level, causing an inhibit voltage to be applied to the first subset of bitlines and the second subset of bitlines.

* * * * *